(12) United States Patent
Yuzawa

(10) Patent No.: US 6,905,915 B2
(45) Date of Patent: Jun. 14, 2005

(54) SEMICONDUCTOR DEVICE AND METHOD OF MANUFACTURING THE SAME, AND ELECTRONIC INSTRUMENT

(75) Inventor: Hideki Yuzawa, Iida (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 10/360,596

(22) Filed: Feb. 6, 2003

(65) Prior Publication Data

US 2003/0219926 A1 Nov. 27, 2003

(30) Foreign Application Priority Data

Feb. 18, 2002 (JP) ........................................ 2002-040098

(51) Int. Cl.$^7$ .............................................. H01L 21/44
(52) U.S. Cl. ........................................ 438/126; 438/615
(58) Field of Search ................................ 438/112, 118, 438/125, 126, 612, 613, 614, 615

(56) References Cited

U.S. PATENT DOCUMENTS

| 5,843,251 | A | 12/1998 | Tsukagoshi et al. |
| 6,113,728 | A | 9/2000 | Tsukagoshi et al. |
| 6,194,250 | B1 * | 2/2001 | Melton et al. ............... 438/126 |
| 6,251,704 | B1 * | 6/2001 | Ohuchi et al. ............... 438/615 |
| 6,258,622 | B1 * | 7/2001 | Lin et al. ............... 438/613 |
| 6,492,199 | B2 * | 12/2002 | Osawa et al. ............... 438/118 |

FOREIGN PATENT DOCUMENTS

| JP | 58-073126 | 5/1983 |
| JP | 3-16147 | 1/1991 |
| JP | 04-010635 | 1/1992 |
| JP | 09-097791 | 4/1997 |
| JP | 10-050708 | 2/1998 |
| JP | 10-335336 | 12/1998 |
| JP | 11-067826 | 3/1999 |
| JP | 11-111768 | 4/1999 |
| JP | 11-307586 | 11/1999 |
| JP | 2001-007159 | 1/2001 |
| JP | 2001-244300 | 9/2001 |
| JP | 2001-313315 | 11/2001 |

* cited by examiner

*Primary Examiner*—Chandra Chaudhari
(74) *Attorney, Agent, or Firm*—Hogan & Hartson, LLP

(57) ABSTRACT

A method of manufacturing a semiconductor device includes mounting of a semiconductor chip on a substrate. In the mounting step, electrodes of the semiconductor chip and leads formed on the substrate are disposed to face each other. Each of the electrodes has a bump including a soldering or brazing material in at least part of a bonding section bonded to corresponding one of the leads. After providing an insulating material around the electrodes and leads, the soldering or brazing material is melted, and the electrodes are respectively bonded to the leads.

20 Claims, 13 Drawing Sheets

SEMICONDUCTOR DEVICE AND METHOD OF MANUFACTURING THE SAME, AND ELECTRONIC INSTRUMENT

Japanese Patent Application No. 2002-40098, filed on Feb. 18, 2002, is hereby incorporated by reference in its entirety.

BACKGROUND OF THE INVENTION

The present invention relates to a semiconductor device, a method of manufacturing the semiconductor device, and an electronic instrument.

Conventionally it has occurred that, in bonding of bumps and leads by face-down bonding, the substrate on which the leads are formed expands as a result of the heat of bonding, and the pitch of the leads is corresponding increased, whereby it no longer matches the pitch of the bumps, and discrepancies in the positions of the bumps and leads arise. In this case, when the substrate cools and contracts, the bonded bumps and leads may be tilted. If the substrate is deformed by heat and becomes distorted, leads may contact the semiconductor chip. Further, the alloy of the bumps and leads may extend excessively in their pitch direction, and adjacent bumps and leads may be shorted. Thus there are problems in the reliability of conventional face-down bonding.

SUMMARY OF THE INVENTION

According to a first aspect of the present invention, there is provided a method of manufacturing a semiconductor device comprising:

disposing a substrate having leads, and a semiconductor chip having bumps each of which includes a soldering or brazing material in at least part of a bonding section bonded to corresponding one of the leads, to oppose a surface of the semiconductor chip having the bumps to a surface of the substrate having the leads;

applying pressure to at least one of the substrate and the semiconductor chip; and melting the soldering or brazing material and using the molten soldering or brazing material to bond the leads to the bumps, wherein an insulating material is provided around the leads and the bumps before the step of bonding the leads to the bumps.

According to a second aspect of the present invention, there is provided a method of manufacturing a semiconductor device comprising:

disposing a semiconductor chip having electrodes, and a substrate having bumps each of which includes a soldering or brazing material in at least part of a bonding section bonded to corresponding one of the electrodes, to oppose a surface of the semiconductor chip having the electrodes to a surface of the substrate having the bumps;

applying pressure to at least one of the substrate and the semiconductor chip; and melting the soldering or brazing material and using the molten soldering or brazing material to bond the electrodes to the bumps, wherein an insulating material is provided around the electrodes and the bumps before the step of bonding the electrodes to the bumps.

A semiconductor device according to a third aspect of the present invention is manufactured by any of the above described methods.

An electronic instrument according to a fourth aspect of the present invention comprises the above described semiconductor device.

DETAILED DESCRIPTION OF THE EMBODIMENT

Figure 1A:
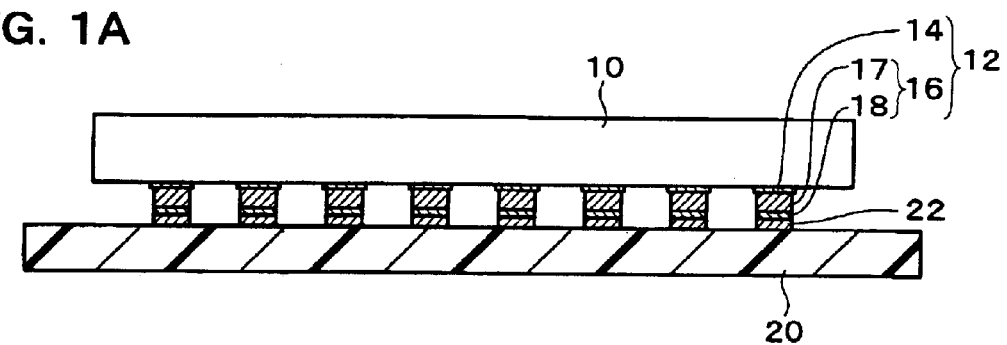
FIGS. 1A to 1C show a method of manufacturing a semiconductor device according to one embodiment of the present invention.

Embodiments of the present invention may provide a semiconductor device of high reliability, a method of manufacturing such a semiconductor device, and an electronic instrument.

(1) According to one embodiment of the present invention, there is provided a method of manufacturing a semiconductor device comprising:

disposing a substrate having leads, and a semiconductor chip having bumps each of which includes a soldering or brazing material in at least part of a bonding section bonded to corresponding one of the leads, to oppose a surface of the semiconductor chip having the bumps to a surface of the substrate having the leads;

applying pressure to at least one of the substrate and the semiconductor chip; and melting the soldering or brazing material and using the molten soldering or brazing material to bond the leads to the bumps, wherein an insulating material is provided around the leads and the bumps before the step of bonding the leads to the bumps.

In this embodiment of the invention, since the leads and bumps are bonded by the soldering or brazing material, it is not necessary to apply heat at a high temperature, and expansion of the substrate is reduced. Therefore, the occurrence of positional deviation of the leads and bumps can be avoided, tilting of the bonded leads and bumps can also be avoided, and contact of the leads with the semiconductor chip can also be avoided. Further, since the soldering or brazing material is melted after providing the insulating material around the leads and bumps, there is less tendency for the molten soldering or brazing material or an alloy to spill in the lateral direction of the leads and bumps, and shorting to the adjacent leads and bumps can be avoided.

(2) According to one embodiment of the present invention, there is provided a method of manufacturing a semiconductor device comprising:

disposing a semiconductor chip having electrodes, and a substrate having bumps each of which includes a soldering or brazing material in at least part of a bonding section bonded to corresponding one of the electrodes, to oppose a surface of the semiconductor chip having the electrodes to a surface of the substrate having the bumps;

applying pressure to at least one of the substrate and the semiconductor chip; and melting the soldering or brazing material and using the molten soldering or brazing material to bond the electrodes to the bumps, wherein an insulating material is provided around the electrodes and the bumps before the step of bonding the electrodes to the bumps.

In this embodiment of the present invention, since the electrodes and bumps are bonded by the soldering or brazing material, it is not necessary to apply heat at a high temperature, and expansion of the substrate is reduced. Therefore, the occurrence of positional deviation of the electrode and bumps can be avoided, tilting of the bonded electrodes and bumps can also be avoided, and contact of the bumps with the semiconductor chip can also be avoided. Further, since the soldering or brazing material is melted after providing the insulating material around the electrodes and bumps, there is less tendency for the molten soldering or brazing material or an alloy to spill in the lateral direction of the electrodes and bumps, and shorting to the adjacent electrodes and bumps can be avoided.

(3) In these methods of manufacturing a semiconductor device, the insulating material may be disposed between the semiconductor chip and the substrate in the step of disposing the semiconductor chip and the substrate.

(4) In these methods of manufacturing a semiconductor device, the insulating material may be injected between the semiconductor chip and the substrate after the step of applying pressure to at least one of the substrate and the semiconductor chip.

(5) In these methods of manufacturing a semiconductor device, the insulating material may be a resin; and the resin may be cured after the step of providing the resin around the electrodes (or leads) and the bumps and before the step of bonding the electrodes (or leads) to the bumps.

(6) In these methods of manufacturing a semiconductor device, each of the bumps may include a first metal layer and a second metal layer formed on the first metal layer, the second metal layer being formed of a material having a greater affinity for the soldering or brazing material than the first metal layer.

(7) According to one embodiment of the present invention, there is provided a semiconductor device manufactured by any of the above described methods.

(8) According to one embodiment of the present invention, there is provided an electronic instrument having the above described semiconductor device.

Figure 1B:
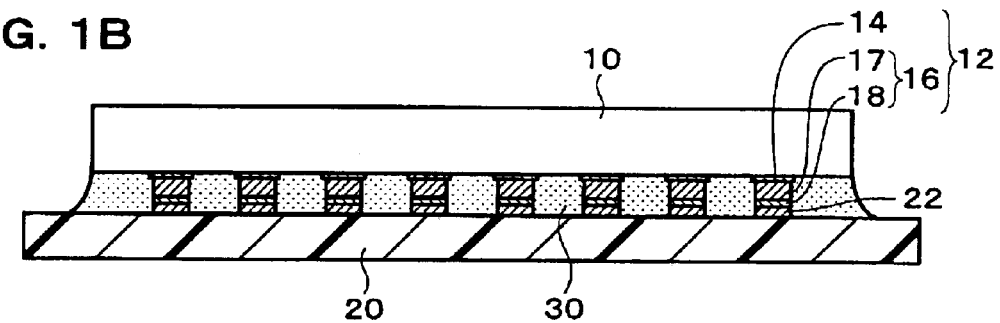
Figure 1C:
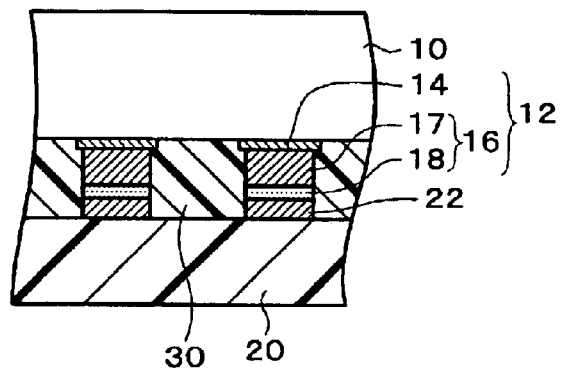

An embodiment of the present invention will be described below with reference to the drawings. In this embodiment of the method of manufacturing a semiconductor device, the description concerns examples in which bumps are provided on a semiconductor chip. FIG. 1A to FIG. 1C show the method of manufacturing a semiconductor device according to one embodiment of the present invention. The method of manufacturing a semiconductor device includes mounting of a semiconductor chip 10 on a substrate 20 by face-down bonding.

The semiconductor chip 10 has a plurality of electrodes 12. In this case, a semiconductor wafer may have a plurality of electrodes 12. Each electrode 12 comprises a pad 14 and bump 16. In this case, the bump 16 is formed on the pad 14, and between the pad 14 and the bump 16 may be formed a metal layer, such as of under-bump metal or the like. The pad 14 is formed, for example, of aluminum. The bump 16, as described below, comprises a soldering or brazing material 18 provided on a metal layer 17. That is to say, the bump 16 includes in at least part the soldering or brazing material 18 for bonding to a lead 22. For example, the soldering or brazing material 18 is a material being a low melting point metal such as tin, solder, or the like. The metal layer 17 may, as described below, include a first metal layer and a second metal layer.

The substrate 20 may be a flexible substrate, or may be a rigid substrate. The substrate 20 has a base substrate of, for example, polyimide resin, on which a plurality of leads 22 is formed. An interconnecting pattern is formed by the plurality of leads 22. The lead 22 may be formed as a plurality of metal layers.

As shown in FIG. 1A, the semiconductor chip 10 and substrate 20 are disposed with the electrodes 12 and leads 22 opposed. That is to say, the semiconductor chip 10 and substrate 20 are mutually positioned. Then as shown in FIG. 1B, an insulating material 30 is provided around the electrodes 12 and leads 22. The insulating material 30 is not particularly limited, as long as it is electrically insulating, and may be a resin (for example, an adhesive). The insulating material 30 in liquid form may be injected between the semiconductor chip 10 and substrate 20. Alternatively, the insulating material 30 may be provided on at least one of the surface of the semiconductor chip 10 on which the electrodes 12 are formed and the surface of the substrate 20 on which the leads 22 are formed, after which the semiconductor chip 10 and substrate 20 are brought into intimate contact, with the insulating material 30 interposed. In this case, the insulating material 30 may be used in sheet form. Here the insulating material 30 may be cured.

Next, as shown in FIG. 1C, by means of heating, the soldering or brazing material 18 is melted, and the electrodes 12 and leads 22 are bonded. The molten soldering or brazing material 18 and the leads 22 may form a eutectic alloy. According to this embodiment, since the electrodes 12 and leads 22 are bonded by the soldering or brazing material 18, the application of high temperature heat is not required, and expansion of the substrate 20 is reduced. Therefore, the occurrence of positional deviation of the electrodes 12 and leads 22 can be avoided, tilting of the bonded electrodes 12 or leads 22 can be avoided, and contact of the leads 22 with the semiconductor chip 10 can also be avoided. Further, since the soldering or brazing material 18 is melted after providing the insulating material 30 around the electrodes 12 and leads 22, molten soldering or brazing material 18 or alloy has limited tendency to flow in the pitch direction of the electrodes 12 and leads 22, and shorting of adjacent electrodes 12 and leads 22 can be avoided. In particular, since resin is not easily wetted by solder (the solder tending to be repelled), shorting of adjacent electrodes 12 and leads 22 can be more effectively avoided.

The present invention is not limited to this embodiment, and the bumps 16 may be provided on the substrate 20. In this case, each electrode 12 of the semiconductor chip 10 is formed from a pad 14. The leads 22 of the substrate 20 have at least lands and bumps 16 provided over the lands. The bumps 16 include the soldering or brazing material 18 in at least part of bonding sections bonded to the electrodes 12. Between the lands and the bumps 16, another metal layer may be formed. The remainder of this configuration is the same as the above embodiment and further description is omitted.

The bumps 16 can be formed by the following methods.

FIRST EXAMPLE

An example of a method of forming bumps on a semiconductor chip will be described below, but a method of forming bumps according to the present invention is not limited to this example, and may be applied when forming bumps on an interconnecting pattern. In this case, the lands of the interconnecting pattern correspond to the pads. Moreover, the method of forming bumps according to the present invention may also be applied when bumps are formed on pads on a semiconductor wafer. That is to say, the following description can be applied not only to a semiconductor chip, but also to a semiconductor wafer.

Figure 2A:
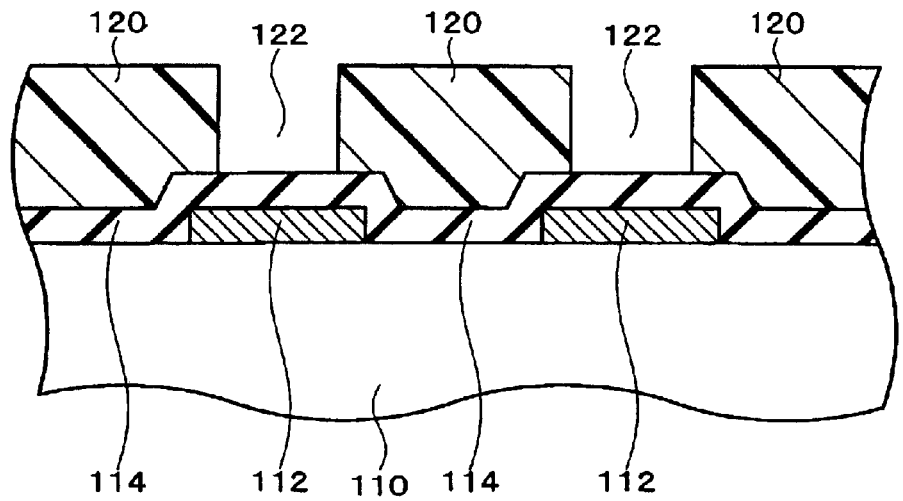
FIGS. 2A to 2C are illustrative of a method of forming bumps.

As shown in FIG. 2A, a resist layer 120 is formed. The resist layer 120 is formed on the surface of a semiconductor chip 110 on which pads 112 are formed, that is to say, over an insulating film 114. The resist layer 120 has penetrating holes 122 over the pads 112. The penetrating holes 122 may be formed by applying a photolithography technique. That is to say, energy may be applied to the photosensitive resist layer 120 through a mask, and the penetrating holes 122 formed by development. At this point, the resist layer 120 may be either a positive or a negative resist. It should be noted that the resist layer 120 may be formed with a thickness on the order of 20 $\mu$m.

Alternatively, a non-photosensitive resist layer 120 may be etched to form the penetrating holes 122. The resist layer 120 may also be formed by application of a screen printing or inkjet method.

The penetrating holes 122 are preferably formed so as not to extend beyond the periphery of the pads 112. By means of this, the bumps can be formed on each of the plurality of pads 112 provided with narrow pitch. It is preferable for the penetrating holes 122 to be formed with wall surfaces standing perpendicularly to the surface of the semiconductor chip 110. By means of this, perpendicularly rising bumps can be formed. It should be noted that the plan form of the penetrating holes 122 is not limited, and may be, for example, circular or rectangular.

Figure 2B:
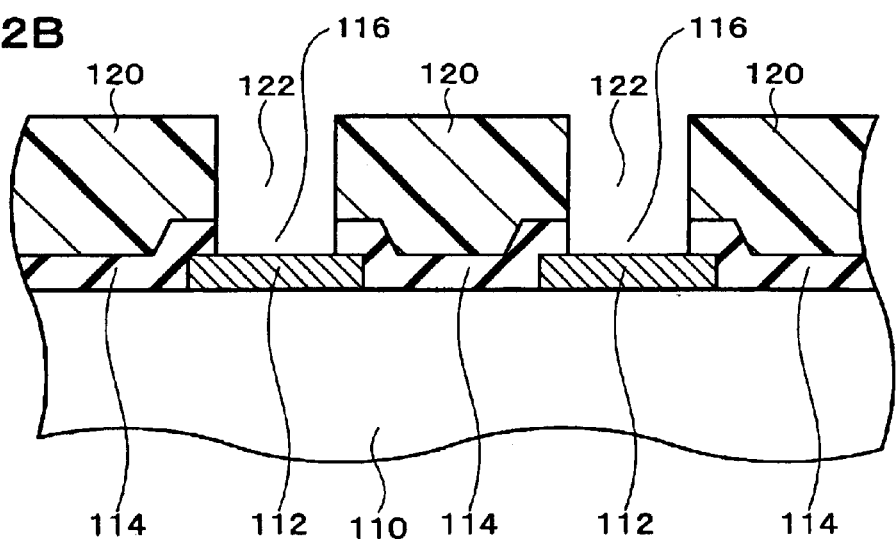

As shown in FIG. 2B, with the resist layer 120 as a mask, portions of the insulating film 114 within the penetrating holes 122 are removed, and openings 116 exposing at least a part of the pads 112 are formed. The openings 116 can be formed by etching. The etching means may be chemical, physical, or may use a combination of these characteristics. The etching characteristics may be isotropic or anisotropic. As described below, the present invention can be applied even for isotropic etching, in which etching is equal in all directions.

As shown in FIG. 2B, in this example, in plan view the openings 116 are formed within the boundary of formation of the penetrating holes 122. Such openings 116 can be formed, for example, by anisotropic etching. By means of this, if a first metal layer 130 is formed within the penetrating holes 122, it is possible to avoid the surface of the pads 112 being exposed. By using the penetrating holes 122 formed in the resist layer 120, the openings 116 in the insulating film 114 can be easily formed.

Figure 2C:
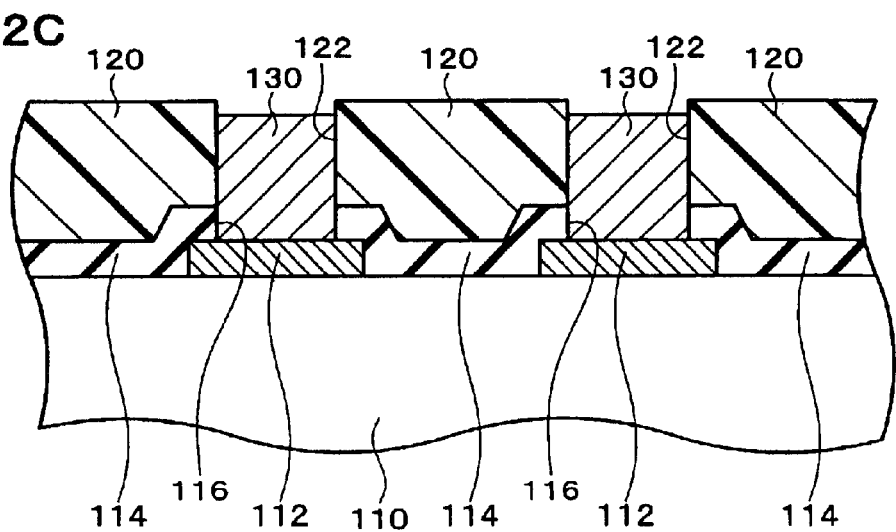

As shown in FIG. 2C, the first metal layer 130 is formed in the penetrating holes 122. Since the penetrating holes 122 communicate with the openings 116, by forming the first metal layer 130 in the penetrating holes 122, bumps can be formed that are electrically connected to the pads 112. The first metal layer 130 may be formed so as not to exceed the height of the penetrating holes 122, that is to say, entirely within the penetrating holes 122. Alternatively, the first metal layer 130 may be flush with the surface of the resist layer 120, or may be formed to exceed the height of the penetrating holes 122. The first metal layer 130 may be formed of nickel (Ni), copper (Cu), gold (Au), or the like. The first metal layer 130, as shown in FIG. 2C may be a single layer, or may be formed from multiple other layers.

The first metal layer 130 may be formed by electroless plating (including displacement plating). For example, when the pads 112 are formed of aluminum, using an alkaline zinc solution, zincate processing is carried out over the pads 112, and a displacement deposition of zinc is formed on the surface of the aluminum. In this case, it is preferable for the resist layer 120 to be previously heated to 200° C. or thereabouts. By means of this, the resistance of the resist layer 120 with respect to a strongly alkaline solution can be increased. To prevent thermal deformation of the resist layer 120, the resist layer 120 may be irradiated with ultraviolet radiation. It should be noted that when zinc is deposited on the surface of the pads 112, after immersing the pads 112 in an alkaline zinc solution, the substituted zinc may be dissolved by nitric acid, and reimmersion in an alkaline zinc solution carried out. Next, the displaced pads 112 with the surface substituted by zinc is provided with an electroless nickel plating fluid, and by a zinc-nickel substitution reaction, a first metal layer 130 formed of nickel is formed on the pads 112.

It should be noted that before applying zincate processing to the pads 112, it is preferable for residues of the insulating film 114 of the semiconductor chip 110 to be dissolved with a particular solution (for example, dilute hydrofluoric acid solution). Further, after dissolving residues of the insulating film 114, it is preferable for the pads 112 to be immersed in an alkaline solution, to remove an oxide film from the exposed parts of the pads 112. By these means, the surface of the pads 112 can be satisfactorily subjected to aluminum substitution.

It should be noted that for example, when the first metal layer 130 is formed over the pads 112 by zincate processing, a part of the zinc layer over the aluminum (pads 112) may be left remaining. In this case, the first metal layer 130 also includes a zinc layer.

Alternatively, as an alternative to zincate processing, the aluminum pads 112 may be subjected to a solution including a reducing agent such as palladium or the like, and then an electroless nickel plating fluid provided, whereby the first metal layer 130 of nickel with nuclei of palladium or the like is deposited over the pads 112. In general, nickel can be formed more rapidly than gold. It should be noted that the thickness of the first metal layer 130 may be between 15 and 25 µm or thereabouts.

Figure 3A:
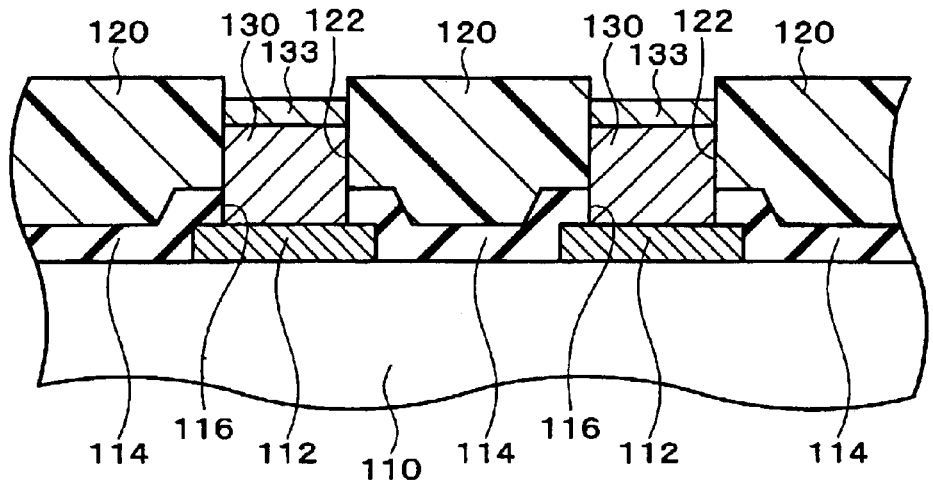
FIGS. 3A to 3C are illustrative of a method of forming bumps.

As shown in FIG. 3A, a second metal layer 133 is formed with the resist layer 120 remaining in place. That is to say, the second metal layer 133 is formed on the top surface of the first metal layer 130. The second metal layer 133 may be either a single layer or multiple layers. The second metal layer 133 may be formed of gold (Au). When the second metal layer 133 is formed of multiple layers, at least the surface layer may be formed of gold. The thickness of the second metal layer 133 may be between 0.1 and 0.2 µm or thereabouts. It should be noted that the second metal layer 133 may be formed by electroless plating.

Figure 3B:
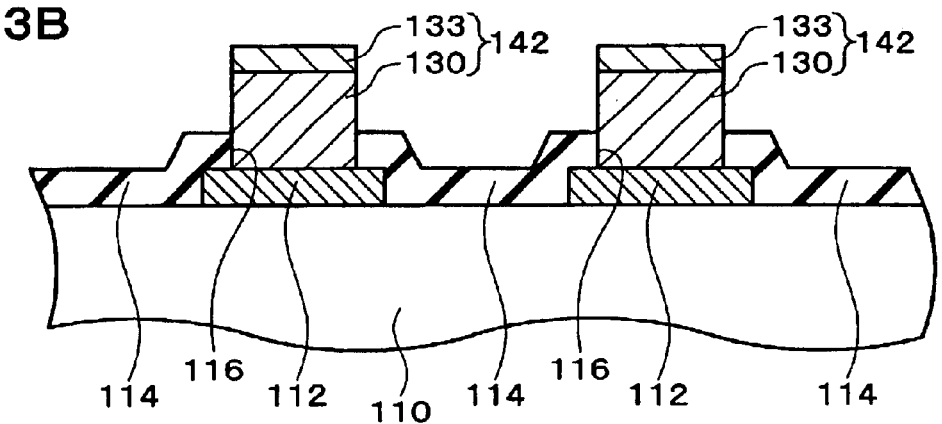

As shown in FIG. 3B, the resist layer 120 is removed. In this way, a metal layer 142 including the first and second metal layers 130 and 133 is formed.

Figure 3C:
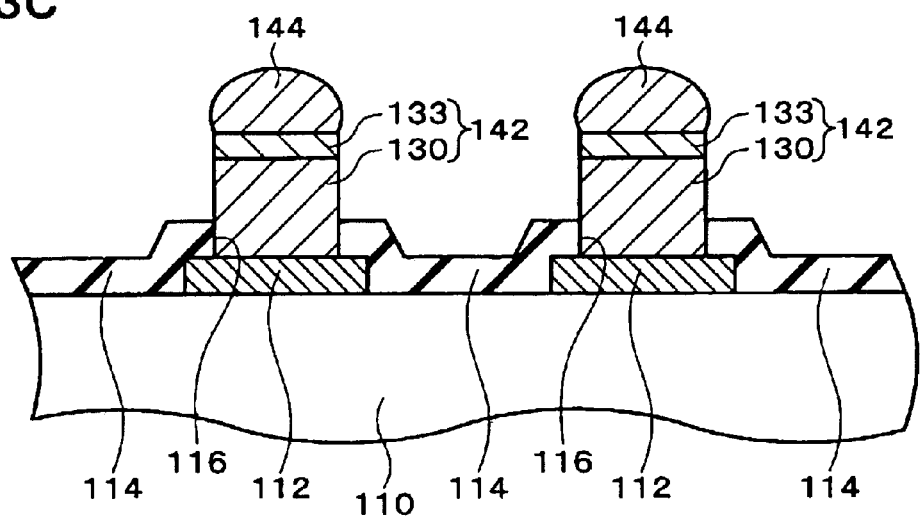

Next, as shown in FIG. 3C, a soldering or brazing material 144 is disposed on the metal layer 142. More specifically, the soldering or brazing material 144 is disposed on the second metal layer 133. The soldering or brazing material 144 may be of either soft solder or hard solder, and may for example be a solder or concudtive paste or the like.

The second metal layer 133 is preferably formed of a material having more affinity than the first metal layer 130 for the soldering or brazing material 144. When solder is used as the soldering or brazing material 144, the second metal layer 133 is preferably a material more easily wetted than the first metal layer 130 by the solder. For example, as described above, at least the surface of the second metal layer 133 may be formed of gold. By means of this, the second metal layer 133 can be provided with the soldering or brazing material 144 in good condition. It should be noted that the material of the second metal layer 133 is not limited to gold, and may be another metal with good affinity for the soldering or brazing material 144.

When solder is disposed on the metal layer 142, for example, the upper surface (the second metal layer 133) of the metal layer 142 may be immersed in a solder bath, that is to say, the dipping method may be used. In this case, since the solder tends to adhere to the gold layer (the second metal layer 133) the solder can easily be provided over the metal layer 142. Alternatively, by bringing the metal layer 142 into contact with a surface of molten solder, the solder may be applied to the second metal layer 133. A printing method or inkjet method may be used to dispose the solder on the metal layer 142. The solder may be formed from a material including tin (Sn) and silver (Ag). The height of the solder disposed on the metal layer 142 may be, for example, 10 to 20 µm or thereabouts. It should be noted that the bumps of this example include the metal layer 142 (the first and second metal layers 130 and 133) and the soldering or brazing material 144.

The soldering or brazing material 144 may be a metal including tin (Sn). Alternatively, the soldering or brazing material 144 may be tin (Sn) with the addition of one or a plurality of metals selected from silver (Ag), copper (Cu), bismuth (Bi), and zinc (Zn). The film thickness of the soldering or brazing material 144 is adjusted to avoid short-circuits between adjacent bumps. For example, when the surface of the element contacting the bumps (for example, the leads) is Au, if the film thickness of the soldering or brazing material 144 is from approximately 0.1 to 3 µm, an Sn—Au eutectic bond of sufficient strength can be formed. If the film thickness is of this order, then even if the distance between adjacent bumps is extremely short (for example, approximately 7 µm), then for bonding, carrying out a reflow operation prevents short-circuits between bumps.

Alternatively, as distinct from the example described above, the soldering or brazing material 144 (the second metal layer) may be provided directly on the first metal layer 130. That is to say, the bumps include the first metal layer 130 and the soldering or brazing material 144. The bumps may be formed, for example, by applying the soldering or brazing material 144 to the nickel layer (the first metal layer 130). The soldering or brazing material 144 may be formed to cover the whole of the first metal layer 130, or may be formed on the upper surface of the first metal layer 130.

In this example, the metal layer 142 has the second metal layer 133 on its upper surface, and therefore, for example, when the second metal layer 133 is of a material having high affinity for the soldering or brazing material 144, the amount of the soldering or brazing material 144 provided on the metal layer 142 can be adjusted appropriately. More specifically, the soldering or brazing material 144 can be provided on the upper surface of the metal layer 142 only.

SECOND EXAMPLE

Figure 4A:
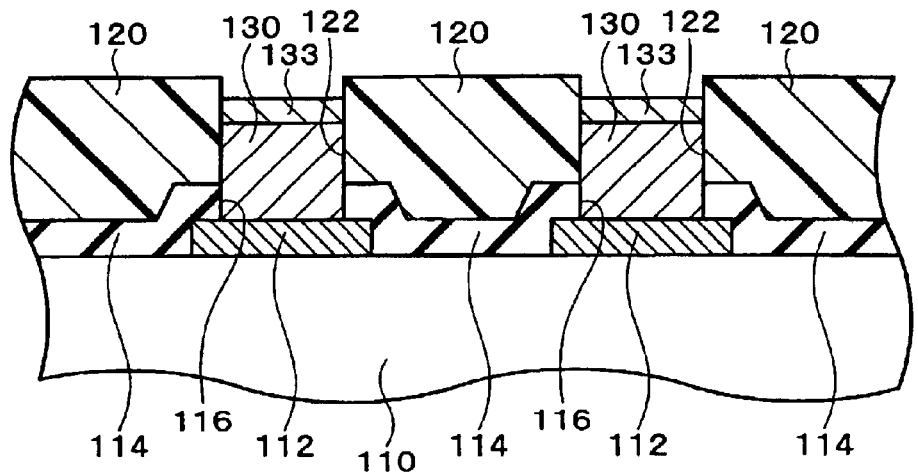
FIGS. 4A and 4B are illustrative of a method of forming bumps.
Figure 4B:
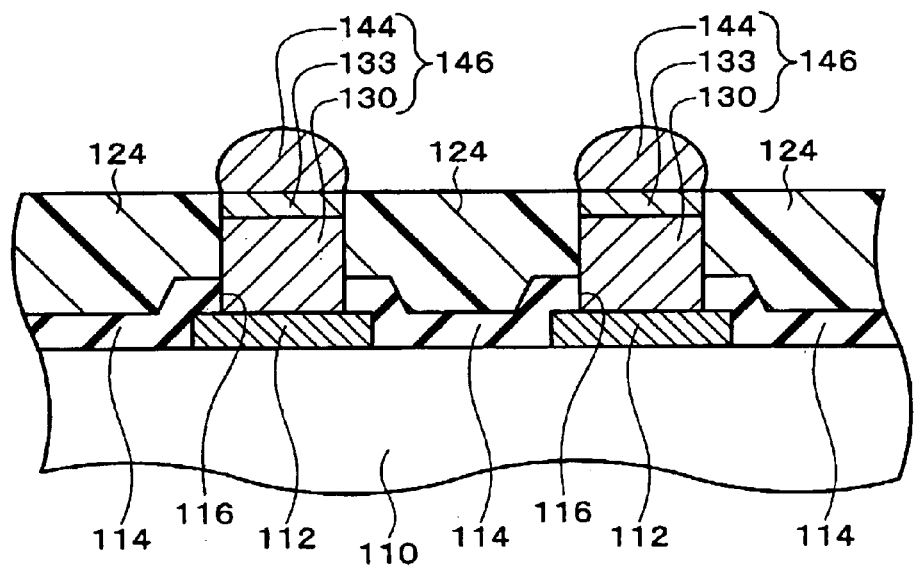

A second example of the method of forming bumps is shown in FIGS. 4A and 4B. The bumps 146 formed by this process (see FIG. 4B) include metal layers (the first and second metal layers 130 and 133) and the soldering or brazing material 144. In this example, the soldering or brazing material 144 is provided with a resin layer 124 formed around the metal layers (the first and second metal layers 130 and 133).

As shown in FIG. 4A, the first and second metal layers 130 and 133 are formed. The resist layer 120 may be left remaining, and the second metal layer 133 formed on the upper surface of the first metal layer 130. Alternatively, after removing the resist layer 120, the second metal layer 133 may be formed to cover the surface of the first metal layer 130. It should be noted that the second metal layer 133 may be formed of a material having greater affinity than the first metal layer 130 for the soldering or brazing material 144. In other words, the second metal layer 133 may be formed of a material more easily adhering to the soldering or brazing material 144 than the first metal layer 130.

Next, as shown in FIG. 4B, the soldering or brazing material 144 is disposed on the metal layers (the first and second metal layers 130 and 133). This process is carried out by providing a resin layer 124 around the metal layers (the first and second metal layers 130 and 133).

The resin layer 124 is provided to avoid a part of the metal layers (the first and second metal layers 130 and 133) formed on the pads 112. In more detail, the resin layer 124 is disposed to expose at least a part of the second metal layer 133. The resin layer 124 may be provided to avoid the upper surface of the metal layers (the first and second metal layers 130 and 133). As shown in the drawings, the resin layer 124 may be provided to be substantially coplanar with the upper surface of the metal layers (first and second metal layers).

After the resist layer 120 is removed, the resin layer 124 may be newly formed around the metal layers (the first and second metal layers 130 and 133). Alternatively, the resist layer 120 may be left remaining, and used as the resin layer 124. In the latter case, since the resist layer 120 having once had formed the layer(s) for forming the metal layer (at least the first metal layer 130) and the layer for providing the soldering or brazing material 144 is used, a simplification of the process is achieved. It should be noted that when the resist layer 120 is used as the resin layer 124, the second metal layer 133 is preferably formed to be substantially coplanar with the resist layer 120.

The resin layer 124 can be formed by applying photolithography techniques, etching, screen printing, an inkjet method, application by dispenser or similar methods. For example, polyimide resin may be provided by application to the surface of the semiconductor chip 110 on which the pads 112 are formed, to avoid the plurality of metal layers (the first and second metal layers 130 and 133), and so as to be substantially coplanar with the upper surface thereof. Then, if necessary, by etching or the like, the upper surface of the metal layers (the first and second metal layers 130 and 133) may be exposed. In this case, an oxygen plasma may be irradiated to carry out the exposure. It should be noted that by exposing a part of the metal layers (the first and second metal layers 130 and 133) by etching or the like, the thickness of the resin layer 124 may be made somewhat less than the thickness (height) of the metal layers (the first and second metal layers 130 and 133).

In this way, after the resin layer 124 is formed, the soldering or brazing material 144 is provided on the metal layers (the first and second metal layers 130 and 133). The soldering or brazing material 144 may be that already described above, being for example, solder (for example, an alloy including tin, silver and copper). The soldering or brazing material 144 may be provided by contacting at least the surface of the metal layers (the first and second metal layers 130 and 133) exposed by the resin layer 124 to the surface of molten solder. In this case, if the second metal layer 133 is formed of a material having greater affinity for the soldering or brazing material 144, the soldering or brazing material 144 can be reliably provided on the second metal layer 133. It should be noted that the height of the solder provided on the metal layers (the first and second metal layers 130 and 133) may be, for example, 10 to 20 $\mu$m or thereabouts.

Since the resin layer 124 is not easily wetted by the solder (tends to repel the solder), an appropriate amount of solder can be provided on the exposed surface of the metal layers (the first and second metal layers 130 and 133) only.

THIRD EXAMPLE

Figure 5A:
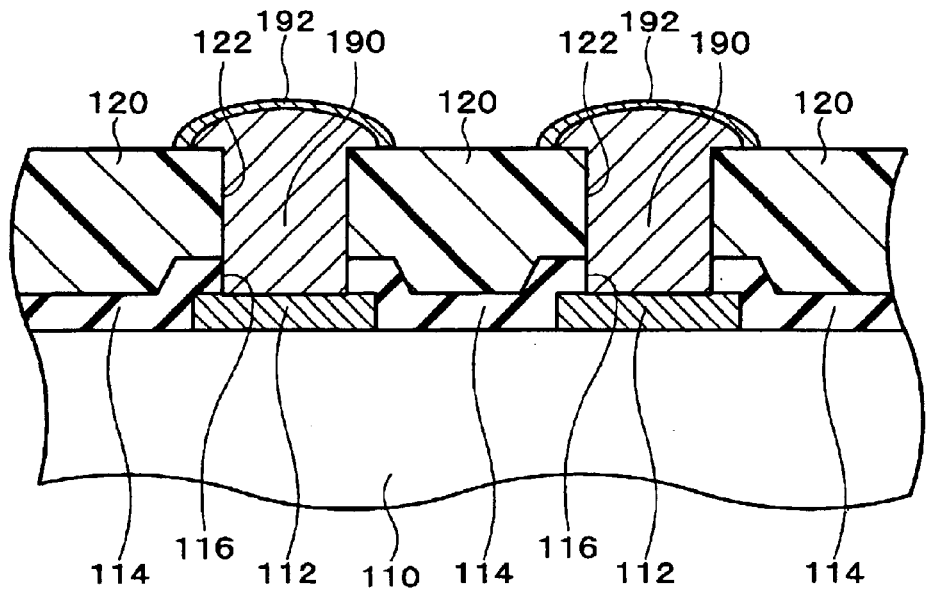
FIGS. 5A and 5B are illustrative of a method of forming bumps.
Figure 5B:
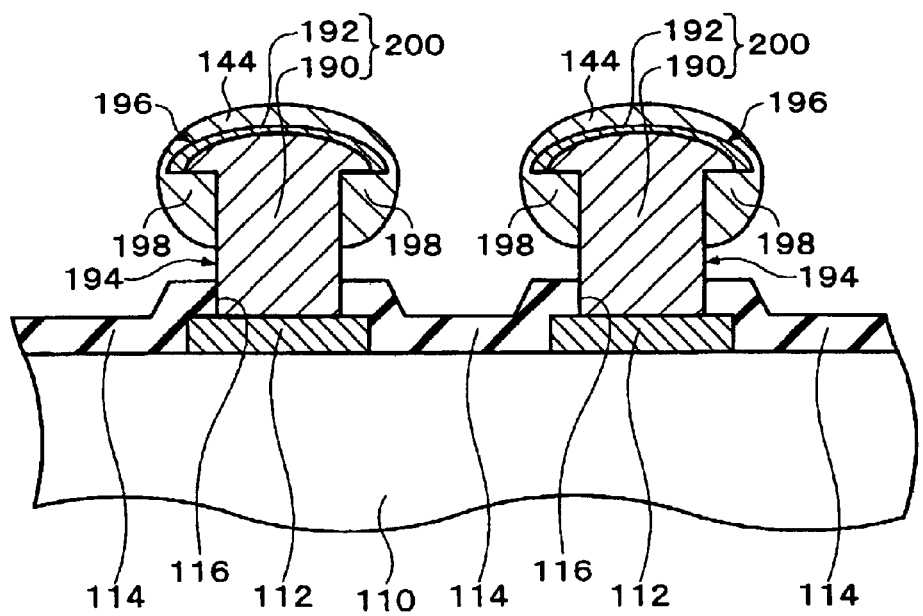

A third example of the method of forming bumps is shown in FIGS. 5A and 5B. In this example, the form of a first metal layer 190 is different from that described above.

As shown in FIG. 5A, the first metal layer 190 is formed to exceed the height of the penetrating holes 122 in the resist layer 120, that is to say, to project to the exterior. In other words, the first metal layer 190 is formed to spill out from the penetrating holes 122. When the first metal layer 190 is formed by electroless plating, the working temperature and time, the amount and pH of the plating fluid, and the number of plating operations (number of turns) and so on, can be used to control the thickness thereof.

The portion of the first metal layer 190 on the outside of the penetrating holes 122 grows in all directions. That is to say, on the outside of the penetrating holes 122 the first metal layer 190 grows not only in the height direction, but also in the width direction. In this way, the first metal layer 190 is formed with its extremities exceeding the width of the penetrating holes 122.

Next, a second metal layer 192 is formed. The second metal layer 192, as shown in the drawings, maybe formed with the resist layer 120 left remaining. In this case, the second metal layer 192 is formed on the extremities of the first metal layer 190 (the portion on the outside of the penetrating holes 122). Alternatively, the second metal layer 192 may be formed after removing the resist layer 120. In this case, the second metal layer 192 may be formed to cover the surface of the first metal layer 190. It should be noted that to other aspects of the first and second metal layers 190 and 192, and to the method of formation the details of the above description can be applied.

As shown in FIG. 5B, the resist layer 120 is removed. In this way, bumps 200 (the first and second metal layers 190 and 192) are formed. A bump 200 comprises a stem portion 194 and an extremity 196.

The stem portions 194 of the bumps 200 are provided to connect to the pads 112. The stem portion 194 has a pillar form (for example, a cylinder or polygonal prism). The stem portion 194 is formed corresponding to the shape of the penetrating holes 122. When the pads 112 are formed not to exceed the penetrating holes 122, the stem portion 194 is formed on the inside of the pads 112 in a plan view of the semiconductor chip 110. The thickness (height) of the stem portion 194 is formed corresponding to the height of the penetrating holes 122 in the resist layer 120.

The extremity 196 of a bump 200 is provided connected to the stem portion 194. The extremity 196 is formed with a greater width than the width of the stem portion 194. For example, when the stem portion 194 is rectangular in plan view of the semiconductor chip 110, the extremity 196 is formed to extend beyond at least one side (and preferably all sides) of the stem portion 194. The extremity 196 of a bump 200 formed on one pad 112, in plan view of the semiconductor chip 110, may project different distances in the direction of an adjacent pad 112 and in another direction. For example, at the extremity 196 the portion extending beyond the stem portion 194 in the direction of the pad 112 may be formed to be shorter than the portion extending beyond the stem portion 194 in another direction. By means of this, electrical contact between the extremities 196 of adjacent pads 112 can be prevented. It should be noted that the extremity 196 may be formed to have a width exceeding the width of the pads 112, or alternatively, may be formed to have a width exceeding the width of the stem portion 194 but less than the width of the pads 112.

The soldering or brazing material 144 is provided on the bumps 200 (metal layer). The soldering or brazing material 144 is as described above, and may, for example, be solder. The method of formation of the soldering or brazing material 144 is as already described. Since the bumps 200 are formed with the extremity 196 larger than the stem portion 194, between the portion of the extremity 196 extending beyond the stem portion 194, and the stem portion 194 itself, there is a space 198 in which the soldering or brazing material 144 can accumulate. For example, the space 198 may be formed in the corner between the surface of the extremity 196 facing the surface of the pads 112, and the side surface of the stem portion 194.

Separately from the example shown in FIGS. 5A and 5B, the second metal layer 192 may be formed to spill out from the penetrating holes 122. That is to say, the first metal layer 190 may be formed with a height not extending beyond the resist layer 120, and with the resist layer 120 left remaining, the second metal layer 192 maybe formed to extend beyond the resist layer 120. In this case also, the above described benefits can be obtained.

FOURTH EXAMPLE

Figure 8A:
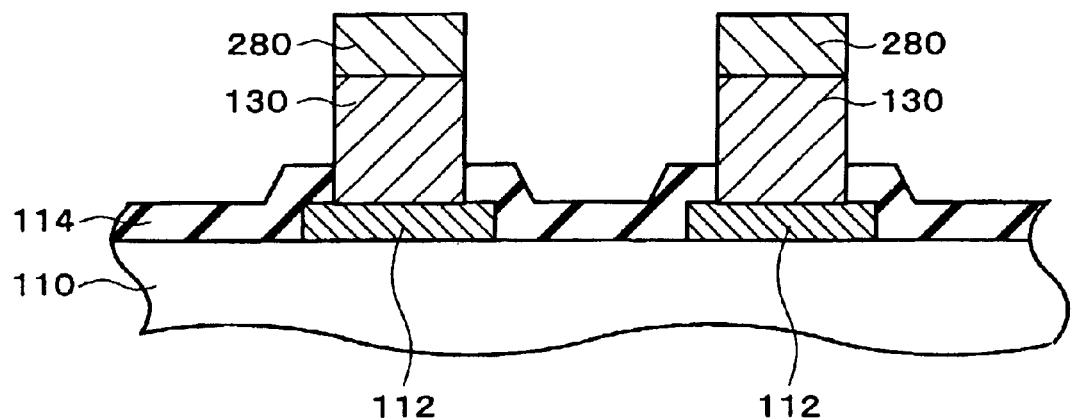
FIGS. 8A and 8B are illustrative of a method of forming bumps.
Figure 8B:
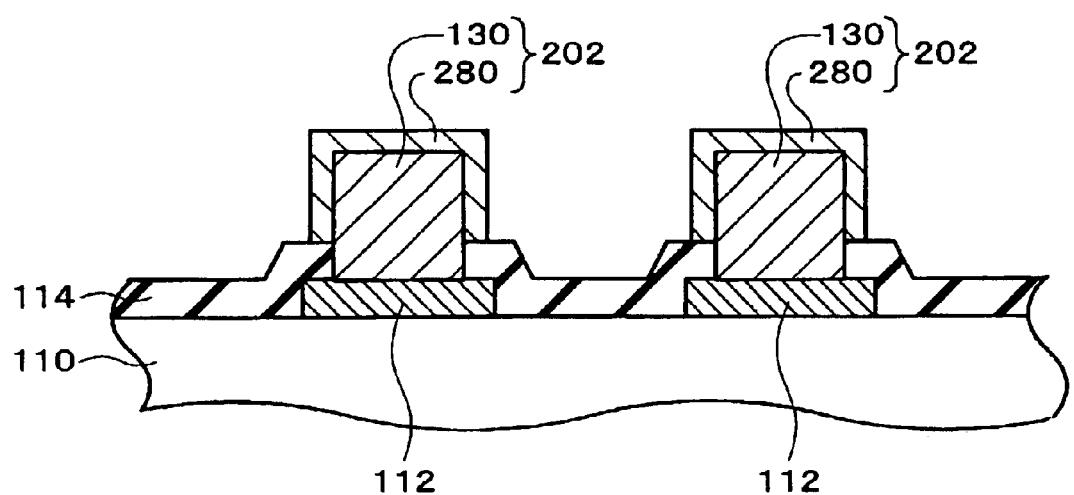
Figure 9A:
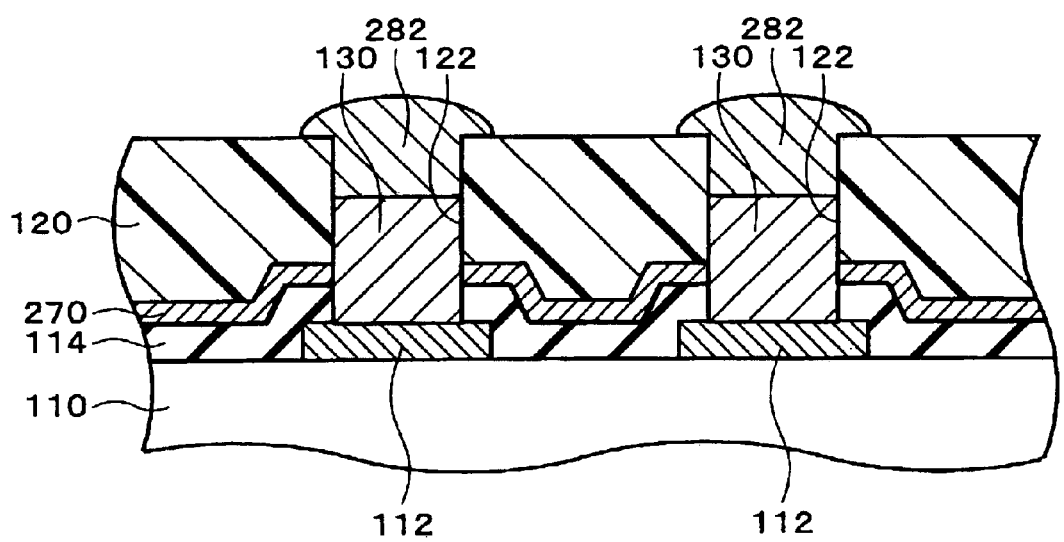
FIGS. 9A and 9B are illustrative of a method of forming bumps.
Figure 9B:
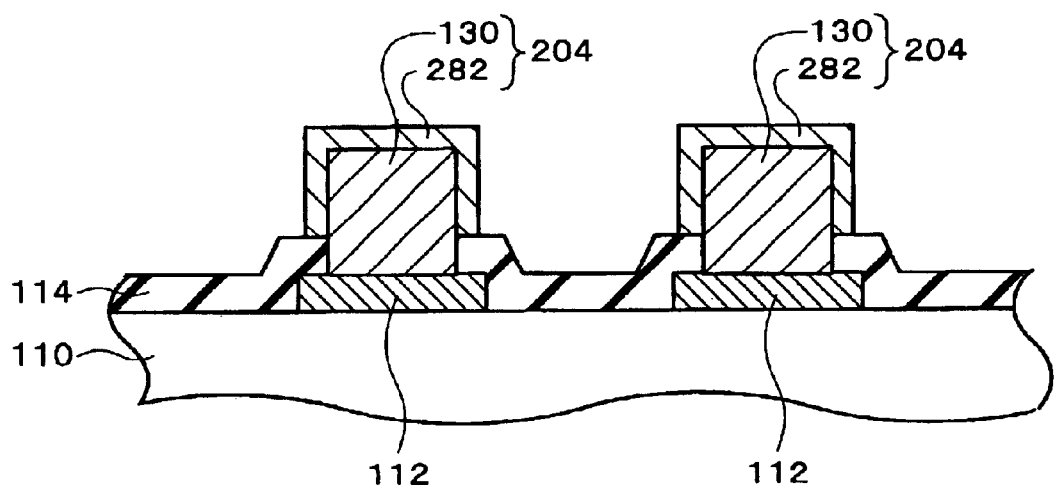

A fourth example of the method of forming bumps is shown in FIGS. 6A to 9B. FIGS. 9A and 9B illustrate a variant form of this example. In this example, a second metal layer 280 is formed by electroplating.

Figure 6A:
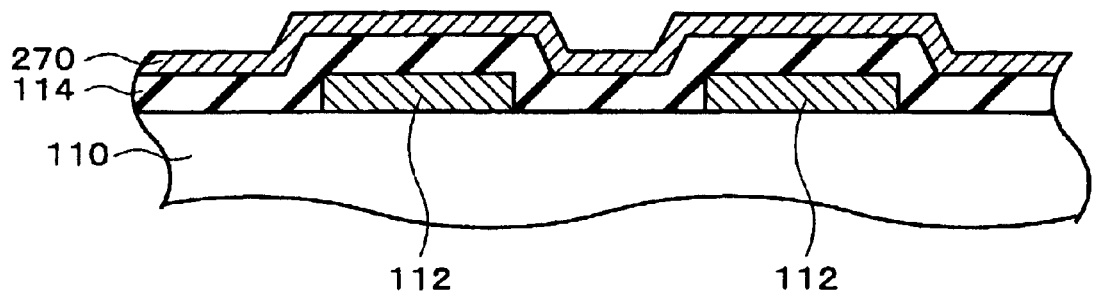
FIGS. 6A to 6C are illustrative of a method of forming bumps.

As shown in FIG. 6A, over the insulating film 114 formed on the semiconductor chip 110, a conductive film 270 is formed. The conductive film 270 forms plating leads for forming the second metal layer 280 by electroplating. The conductive film 270 extends at least from over the pads 112 in a predetermined shape over the insulating film 114. In more detail, the conductive film 270 extends, in plan view of the semiconductor chip 110, in the outer direction of the semiconductor chip 110 from the pads 112. The conductive film 270 may be formed over the insulating film 114 to cover the pads 112. That is to say, the conductive film 270 may be formed in a land form corresponding to the positions of the pads 112. Alternatively, the conductive film 270 may be formed in a linear form to pass over the pads 112. The thickness of the conductive film 270 can be determined freely in view of the electrical connection with the first metal layer 130 formed later, but may, for example, be 50 to 200 nm or thereabouts. The conductive film 270 is not restricted in respect of its material, provided that it is a conductive member, and may be formed, for example, from any material of nickel (Ni), chromium (Cr), titanium (Ti), tungsten (W), or platinum (Pt). The method of formation of the conductive film 270 is not restricted, and for example, it may be formed by sputtering, vacuum deposition, or the like.

Figure 6B:
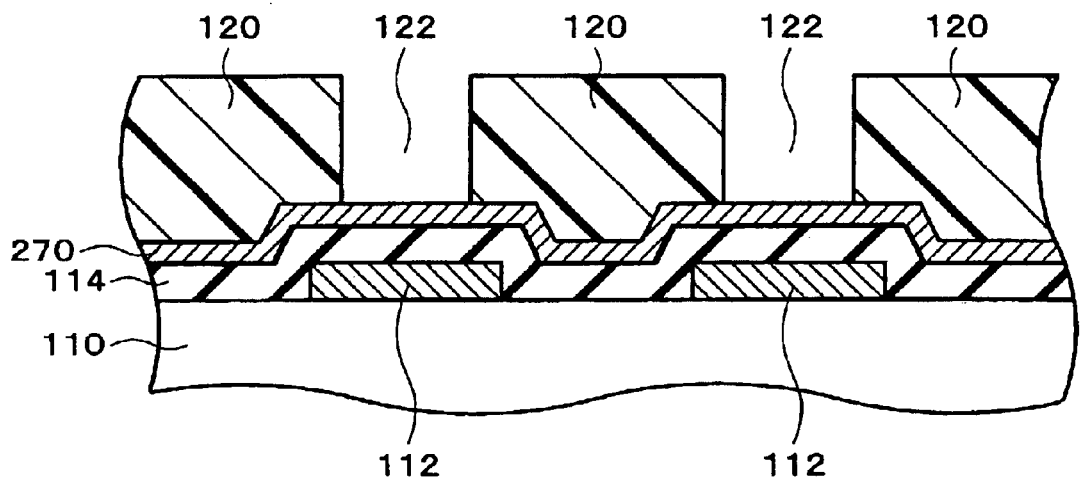

As shown in FIG. 6B, after the formation of the conductive film 270, the resist layer 120 is formed. The resist layer 120 is, formed over the insulating film 114, and over the part of the insulating film 114 over which the conductive film 270 is formed. If part of the conductive film 270 is formed as lands over the pads 112, then the penetrating holes 122 in the resist layer 120 are formed so that their perimeters are positioned on the inside of the lands. By means of this, when openings 272 are formed in the conductive film 270 according to the plan form of the penetrating holes 122, electrical connection between the conductive film 270 and the first metal layer 130 can be achieved. It should be noted that the thickness of the resist layer 120 is not restricted, but may be formed to be, for example, from 15 to 40 $\mu$m or thereabouts.

Figure 6C:
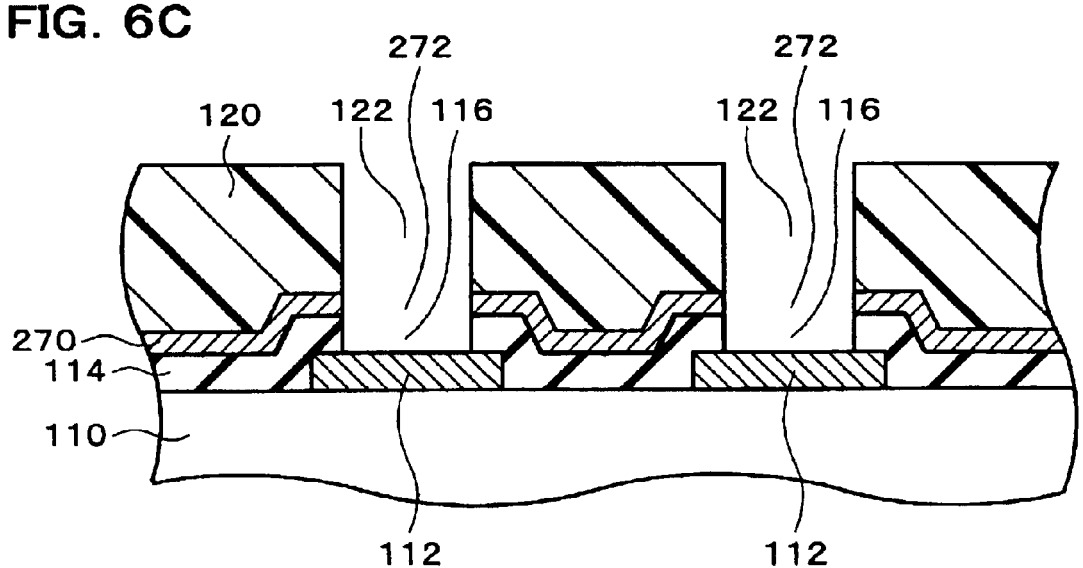

As shown in FIG. 6C, on the inside of each of the penetrating holes 122, the openings 116 in the insulating film 114, and the openings 272 in the conductive film 270 are formed. The openings 116 and 272 are formed to communicate, and by means of this, on the inside of the penetrating holes 122, at least a part of the pads 112 is exposed. The openings 116 and 272 may be formed by etching, and the means of this may be either wet etching or dry etching. The insulating film 114 and conductive film 270 may be perforated integrally, or the openings 272 in the conductive film 270 may be formed first, and subsequently the openings 116 in the insulating film 114 may be formed. The openings 116 and 272 may be formed as shown in the drawing to be substantially the same size as the outer periphery of the penetrating holes 122, or alternatively, may be formed to be of a size not exceeding the outer periphery of the penetrating holes 122.

Figure 7A:
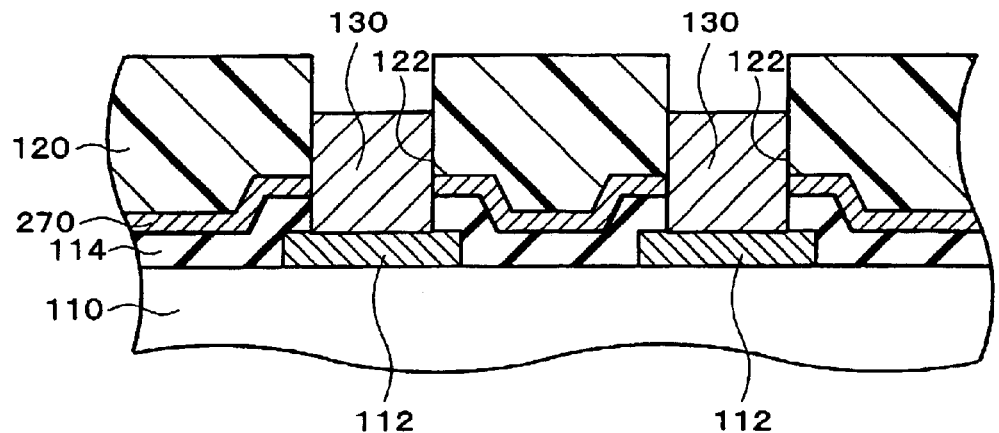
FIGS. 7A to 7C are illustrative of a method of forming bumps.

The first metal layer 130 is formed as shown in FIG. 7A. The first metal layer 130 may be formed by electroless plating. The first metal layer 130 is formed with a height to reach the conductive film 270 within the penetrating holes 122. For example, the first metal layer 130 is formed to be thicker than the sum of the thicknesses of the insulating film 114 and the conductive film 270. By means of this, the first metal layer 130 is able to contact the conductive film 270 on the outer periphery of the penetrating holes 122. The first metal layer 130 maybe formed to be lower than the resist layer 120. In this way, when the second metal layer 280 is formed by electroplating, the second metal layer 280 can be formed with the width of the penetrating holes 122. That is to say, isotropic growth of the second metal layer 280 can be limited, and it can be formed over the first metal layer 130 with a particular width. It should be noted that the thickness (height) of the first metal layer 130 is not restricted, but may be formed to be for example, 1 to 30 $\mu$m or thereabouts.

It should be noted that the first metal layer 130 may be formed of multiple layers. Since the second metal layer 280 is formed of a soldering or brazing material, the upper layer of the first metal layer 130 connecting to the second metal layer 280 may be formed of a material having greater affinity for the soldering or brazing material than the lower layer connecting to the pads 112. For example, the upper layer of the first metal layer 130 may be formed of gold.

Figure 7B:
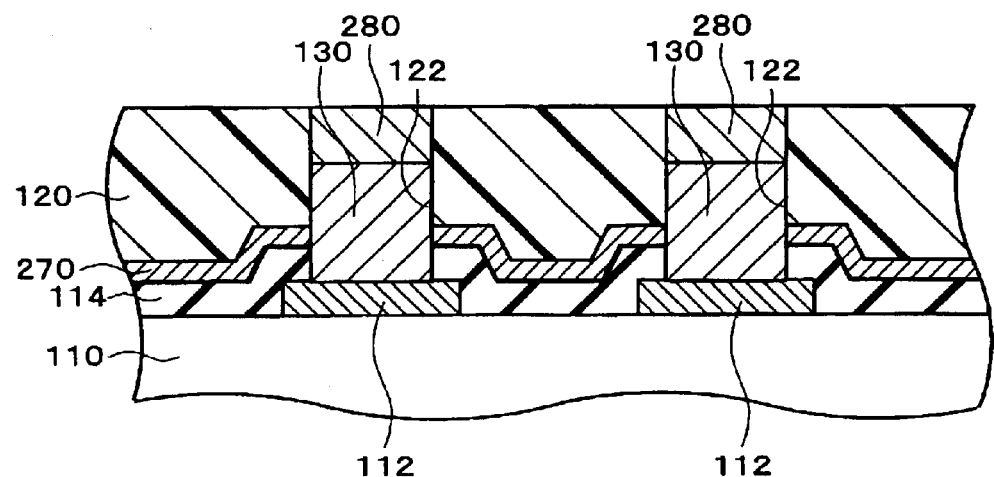

The second metal layer 280 is formed as shown in FIG. 7B. The second metal layer 280 is formed by electroplating. In more detail, by electroplating with the conductive film 270 electrically connecting to the first metal layer 130 as an electrode, the second metal layer 280 connecting to the first metal layer 130 is formed. The second metal layer 280, as shown in the drawing, may be formed to be substantially coplanar with the resist layer 120, or may be formed to be lower than the resist layer 120. The second metal layer 280 is formed of a soldering or brazing material. That is to say, a soldering or brazing material is disposed on the first metal layer 130 provided by electroless plating. For the soldering or brazing material, for example, solder may be used. The solder composition is not restricted, but may be, for example, Sn, Sn—Pb, Sn—Ag, Sn—Cu, Sn—Ag—Cu, SnZn or the like. If the solder is formed by electroplating, the variation in composition can made less than when formed by electroless plating. Therefore, the variability of the melting point of the solder can be reduced. Further, the first metal layer 130 can be formed by a simple process of electroless plating, and therefore the metal layer can be formed more simply than by total formation by electroplating.

Figure 7C:
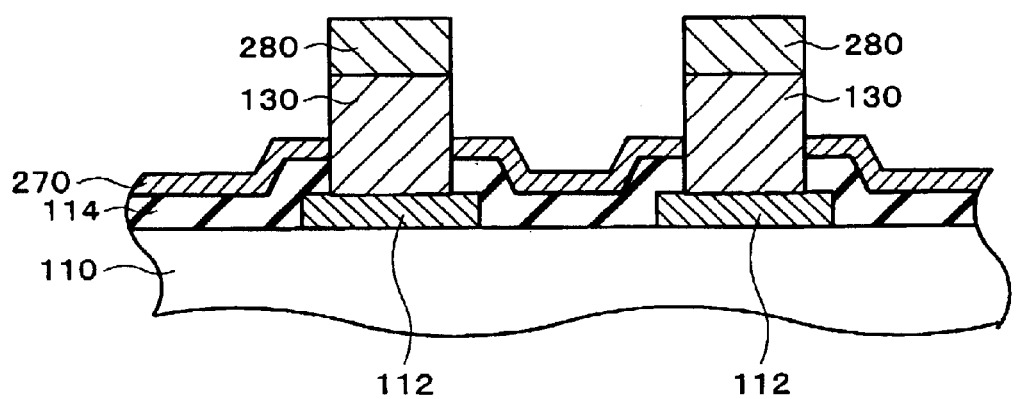

As shown in FIG. 7C, the resist layer 120 is removed. Removing the resist layer 120 exposes the conductive film 270 on the insulating film 114.

As shown in FIG. 8A, the conductive film 270 is removed. The conductive film 270 can be removed by wet etching or dry etching or the like. It should be noted that since the conductive film 270 is removed in this step after forming the second metal layer 280, the conductive film 270 may be previously formed thickly.

As shown in FIG. 8B, after the resist layer 120 and conductive film 270 are removed, if necessary, a reflow step is carried out. The reflow step may be carried out after applying a flux, or may be carried out without a flux, in a nitrogen atmosphere. When a flux is used, after the reflow step is completed, a washing process is preferably carried out. The form of the reflow operation is not restricted, but a reflow furnace such as an infrared furnace, far infrared furnace, or hot air furnace or the like may be used. Irradiation by laser or halogen light or the like may be used, and this may be spot irradiation or overall irradiation. It should be noted that in the above described example, after the resist layer 120 is removed the reflow step is carried out, but alternatively, the reflow step may be carried out with the resist layer 120 left remaining. In this case, when the reflow step is completed, the resist layer 120 is removed.

In this way, bumps 202 including the first and second metal layers 130 and 280 can be formed on the pads 112. By means of this, bumps of high connection reliability can be formed by a simple process.

Next, a variant of this example is shown. After forming the first metal layer 130 as shown in FIG. 7A, as shown in FIG. 9A a second metal layer 282 is formed so as to spill out from the penetrating holes 122. That is to say, the second metal layer 282 is formed higher than the resist layer 120. Thereafter, as shown in FIG. 9B, the resist layer 120 is removed, after which a reflow step is carried out as required. In this way, bumps 204 including the first and second metal layers 130 and 282 can be formed on the pads 112. In this variant example again, the above described benefits can be obtained.

FIFTH EXAMPLE

A fifth example of the method of forming bumps is shown in FIGS. 10A to 11B. In this example, a second metal layer 284 is formed by a printing method.

Figure 10A:
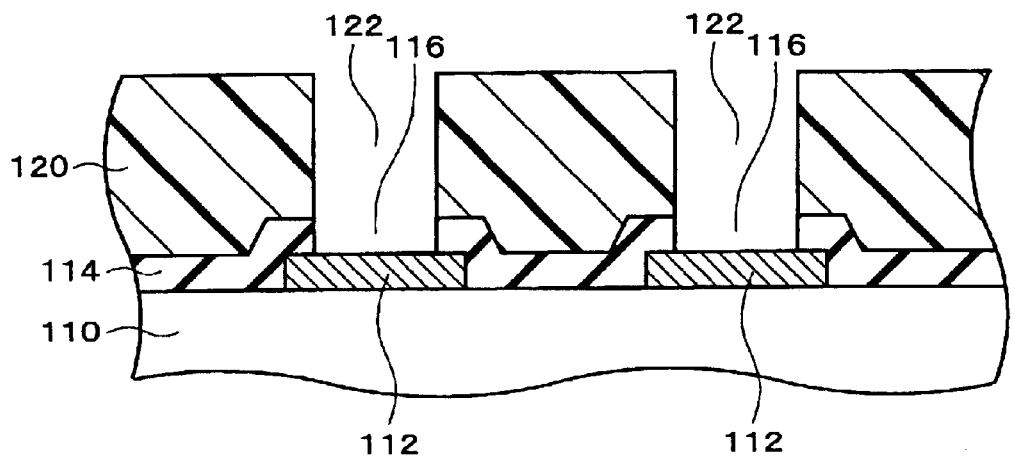
FIGS. 10A to 10C are illustrative of a method of forming bumps.

As shown in FIG. 10A, openings 116 are formed in the insulating film 114 through the penetrating holes 122 in the resist layer 120. By means of this, at least a part of the pads 112 is exposed.

Figure 10B:
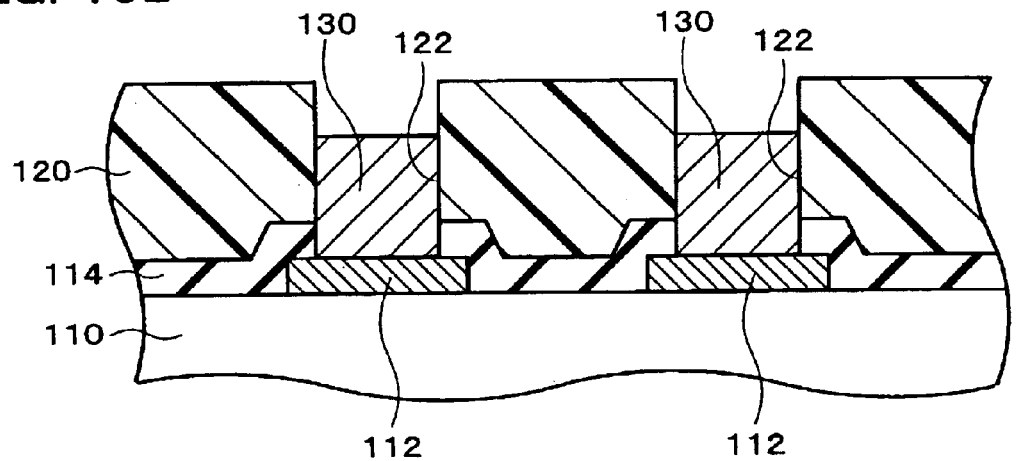

The first metal layer 130 is formed as shown in FIG. 10B. The first metal layer 130 is formed by electroless plating. The first metal layer 130 is formed to be lower than the resist layer 120. In more detail, the first metal layer 130 is formed to be low enough to leave space so that in a subsequent stage, the second metal layer 284 can be formed not to exceed the height of the penetrating holes 122.

It should be noted that the first metal layer 130 may be formed of multiple layers. The second metal layer 284 is formed of a soldering or brazing material. The upper layer connecting to the second metal layer 284 may be formed of a material having greater affinity for the soldering or brazing material than the lower layer connecting to the pads 112. For example, the upper layer of the first metal layer 130 may be formed of gold.

Figure 10C:
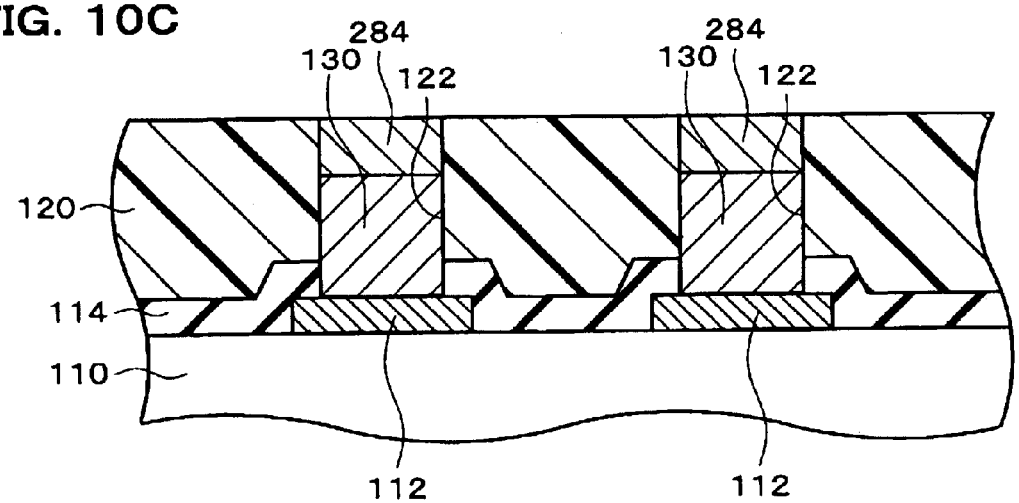

As shown in FIG. 10C, the second metal layer 284 is formed by a printing method. In this case, the resist layer 120 is used as a printing mask. In more detail, the step created by the first metal layer 130 being formed lower than the resist layer 120 is utilized as a mask opening. Here, the second metal layer 284 is a soldering or brazing material, being solder or the like. For example, a solder in paste form is disposed on the resist layer 120, and this is packed into the penetrating holes 122 by a squeegee not shown in the drawings. The thickness of the second metal layer 122 (soldering or brazing material) can be determined appropriately, with relative consideration of the thicknesses of the resist layer 120 and first metal layer 130.

Figure 11A:
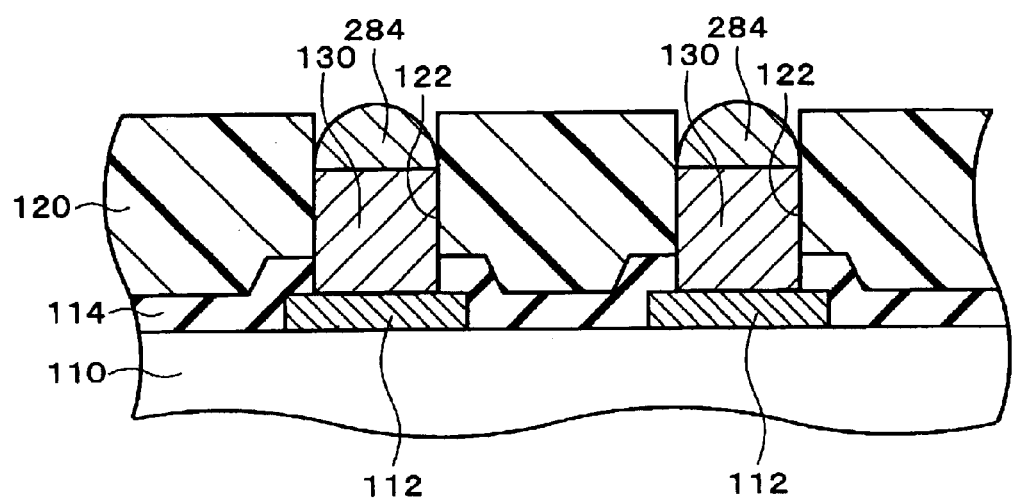
FIGS. 11A and 11B are illustrative of a method of forming bumps.

As shown in FIG. 11A, a reflow step is carried out. The reflow step may be carried out with the resist layer 120 left remaining. For example, laser light or suchlike radiation may be used to cause fusion, resulting in formation of half ball forms by surface tension.

Figure 11B:
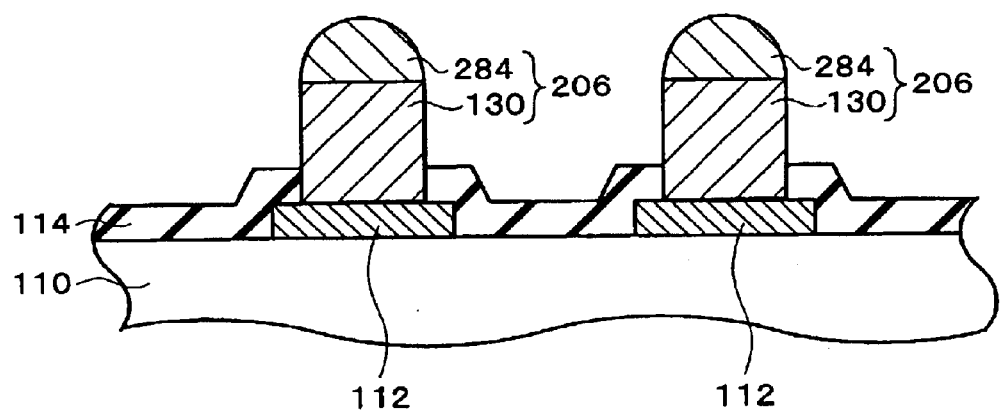

Thereafter, as shown in FIG. 11B, the resist layer 120 is removed. In this way, by removing the resist layer 120, since mask removal is carried out with the second metal layer 284 (soldering or brazing material) formed in the penetrating holes 122, then without considering the goodness or badness of mask removal properties, the second metal layer 284 can be reliably provided over the first metal layer 130. There is no variation in the amount of material applied as a result of smudging into the mask. In this way, bumps 206 including the first and second metal layers 130 and 144 can be formed on the pads 112.

It should be noted that in the above described example, the reflow step is carried out with the resist layer 120 left remaining, but alternatively the reflow step may be carried out after removing the resist layer 120.

According to this example, there is no necessity to form anew a mask for printing, and therefore the second metal layer 284 can be provided in a smaller number of steps. Since it is not necessary to use a metal mask or the like, the number of components used in the manufacturing process can be reduced, and it is not necessary to consider the goodness or badness of mask removal properties.

Figure 12:
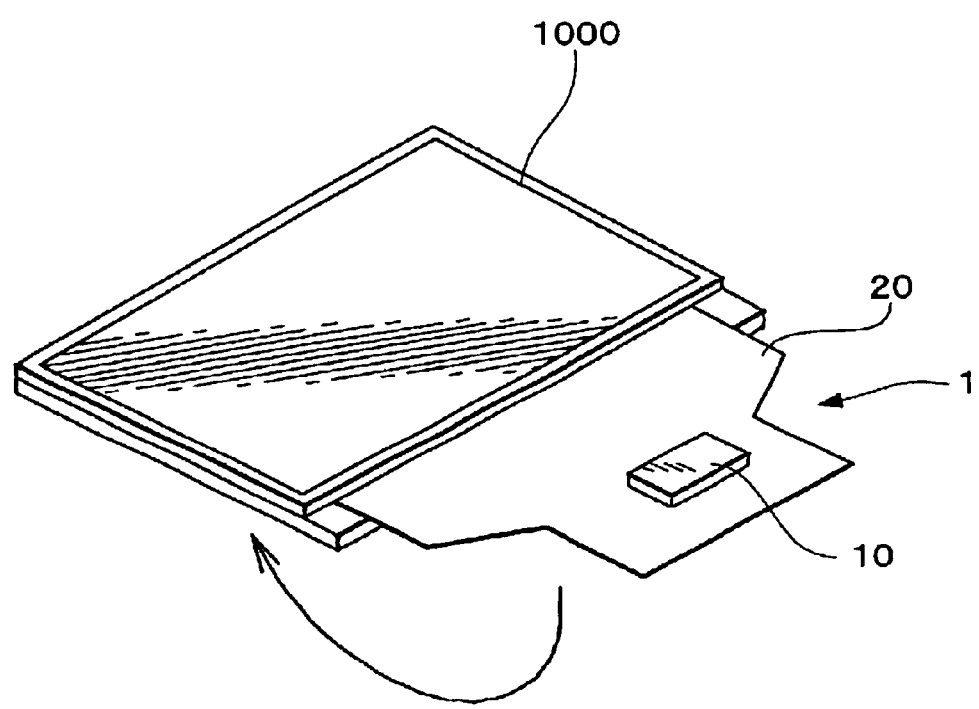
FIG. 12 shows an electronic instrument having a semiconductor device according to one embodiment of the present invention.
Figure 13:
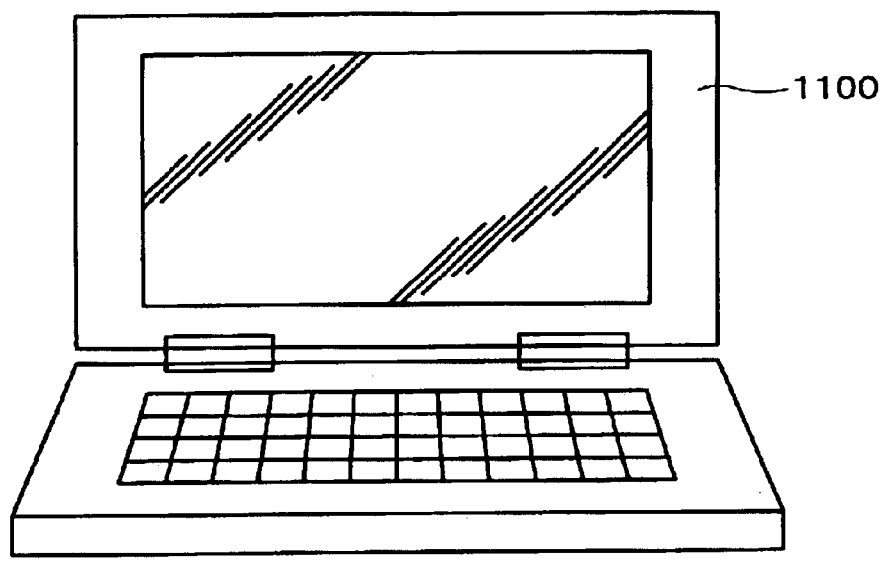
FIG. 13 shows an electronic instrument having a semiconductor device according to one embodiment of the present invention.
Figure 14:
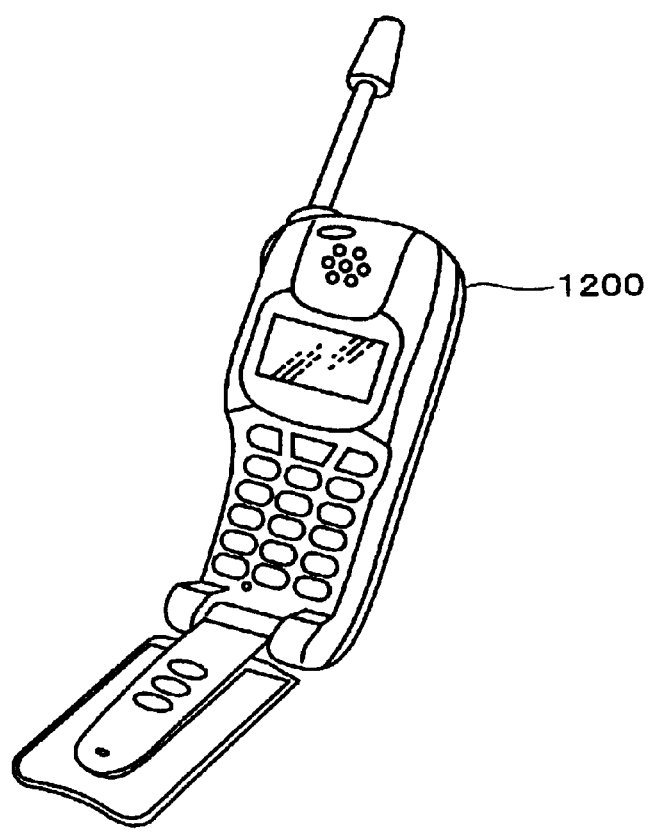
FIG. 14 shows an electronic instrument having a semiconductor device according to one embodiment of the present invention.

FIG. 12 shows an example of the semiconductor device according to one embodiment of the present invention. In this example, a semiconductor device 1, to which the COF (Chip On Film) technique is applied, is fitted to a liquid crystal panel 1000. The semiconductor device 1 comprises the above described semiconductor chip 10 and substrate 20. The liquid crystal panel 1000 can also be referred to as an electronic instrument. As electronic instruments having the semiconductor device according to one embodiment of the present invention, FIG. 13 shows a notebook personal computer 1100, and FIG. 14 shows a mobile telephone 1200.

The present invention is not limited to the above-described embodiments, and various modifications can be made. For example, the present invention includes various other configurations substantially the same as the configurations described in the embodiments (in function, method and effect, or in objective and effect, for example) The present invention also includes a configuration in which an unsubstantial portion in the described embodiments is replaced. The present invention also includes a configuration having the same effects as the configurations described in the embodiments, or a configuration able to achieve the same objective. Further, the present invention includes a configuration in which a publicly known technique is added to the configurations in the embodiments.

What is claimed is:

1. A method of manufacturing a semiconductor device comprising:

disposing a substrate having leads, and a semiconductor chip having bumps each of which includes a soldering or brazing material in at least part of a bonding section bonded to corresponding one of the leads, to oppose a surface of the semiconductor chip having the bumps to a surface of the substrate having the leads;

applying pressure to at least one of the substrate and the semiconductor chip; and melting the soldering or brazing material and using the molten soldering or brazing material to bond the leads to the bumps, wherein an insulating material is provided around the leads and the bumps before the step of bonding the leads to the bumps.

2. The method of manufacturing a semiconductor device as defined in claim 1, wherein the insulating material is disposed between the semiconductor chip and the substrate in the step of disposing the semiconductor chip and the substrate.

3. The method of manufacturing a semiconductor device as defined in claim 1, wherein the insulating material is injected between the semiconductor chip and the substrate after the step of applying pressure to at least one of the substrate and the semiconductor chip.

4. The method of manufacturing a semiconductor device as defined in claim 1, wherein:

the insulating material is a resin; and the resin is cured after the step of providing the resin around the leads and the bumps and before the step of bonding the leads to the bumps.

5. The method of manufacturing a semiconductor device as defined in claim 1, wherein each of the bumps includes a first metal layer and a second metal layer formed on the first metal layer, the second metal layer being formed of a material having a greater affinity for the soldering or brazing material than the first metal layer.

6. The method of manufacturing a semiconductor device as defined in claim 2, wherein each of the bumps includes a first metal layer and a second metal layer formed on the first metal layer, the second metal layer being formed of a material having a greater affinity for the soldering or brazing material than the first metal layer.

7. The method of manufacturing a semiconductor device as defined in claim 3, wherein each of the bumps includes a first metal layer and a second metal layer formed on the first metal layer, the second metal layer being formed of a material having a greater affinity for the soldering or brazing material than the first metal layer.

8. The method of manufacturing a semiconductor device as defined in claim 4, wherein each of the bumps includes a first metal layer and a second metal layer formed on the first metal layer, the second metal layer being formed of a material having a greater affinity for the soldering or brazing material than the first metal layer.

9. A method of manufacturing a semiconductor device comprising:

disposing a semiconductor chip having electrodes, and a substrate having bumps each of which includes a soldering or brazing material in at least part of a bonding section bonded to corresponding one of the electrodes, to oppose a surface of the semiconductor chip having the electrodes to a surface of the substrate having the bumps;

applying pressure to at least one of the substrate and the semiconductor chip; and melting the soldering or brazing material and using the molten soldering or brazing material to bond the electrodes to the bumps, wherein an insulating material is provided around the electrodes and the bumps before the step of bonding the electrodes to the bumps.

10. The method of manufacturing a semiconductor device as defined in claim 9, wherein the insulating material is disposed between the semiconductor chip and the substrate in the step of disposing the semiconductor chip and the substrate.

11. The method of manufacturing a semiconductor device as defined in claim 9, wherein the insulating material is injected between the semiconductor chip and the substrate after the step of applying pressure to at least one of the substrate and the semiconductor chip.

12. The method of manufacturing a semiconductor device as defined in claim 9, wherein:

the insulating material is a resin; and the resin is cured after the step of providing the resin around the electrodes and the bumps and before the step of bonding the electrodes to the bumps.

13. The method of manufacturing a semiconductor device as defined in claim 9, wherein each of the bumps includes a first metal layer and a second metal layer formed on the first metal layer, the second metal layer being formed of a material having a greater affinity for the soldering or brazing material than the first metal layer.

14. The method of manufacturing a semiconductor device as defined in claim 10, wherein each of the bumps includes a first metal layer and a second metal layer formed on the first metal layer, the second metal layer being formed of a material having a greater affinity for the soldering or brazing material than the first metal layer.

15. The method of manufacturing a semiconductor device as defined in claim 11, wherein each of the bumps includes a first metal layer and a second metal layer formed on the first metal layer, the second metal layer being formed of a material having a greater affinity for the soldering or brazing material than the first metal layer.

16. The method of manufacturing a semiconductor device as defined in claim 12, wherein each of the bumps includes a first metal layer and a second metal layer formed on the first metal layer, the second metal layer being formed of a material having a greater affinity for the soldering or brazing material than the first metal layer.

17. A semiconductor device manufactured by the method as defined in claim 1.

18. A semiconductor device manufactured by the method as defined in claim 9.

19. An electronic instrument comprising the semiconductor device as defined in claim 17.

20. An electronic instrument comprising the semiconductor device as defined in claim 18.

* * * * *